Nov. 30, 1965 J. A. WORCESTER 3,221,263

BIAS VOLTAGE STABILIZER INCLUDING A TUNNEL DIODE

Filed Dec. 31, 1962

INVENTOR:
JOSEPH A. WORCESTER,

BY Norman C. Fulmer

HIS ATTORNEY.

United States Patent Office 3,221,263
Patented Nov. 30, 1965

3,221,263
BIAS VOLTAGE STABILIZER INCLUDING A TUNNEL DIODE

Joseph A. Worcester, Frankfort, N.Y., assignor to General Electric Company, a corporation of New York
Filed Dec. 31, 1962, Ser. No. 248,467
6 Claims. (Cl. 330—40)

This invention relates to voltage stabilizers, and more specifically to low voltage stabilizers, such as used to regulate the bias voltage in semi-conductor circuits.

With the discovery of the transistor, and other semiconductor devices, has come an increased use of and capability in compact, portable electronic equipment. The increase in use of portable equipment is due to large measure to the low level of power consumed by semiconductor circuits, when compared to the power consumed by comparable vacuum tube circuits. Diminutive power supplies may be used with long life expectancy. The low level of power consumed by transistor circuits has made practical portable electronic equipment, such as radio receivers, for example, having a long useful life even when supplied with energy from such sources as flashlight or pen light battery cells.

A long useful life for battery-powered equipment depends to a large extent upon designing the transistorized circuits to perform adequately with a wide range of power supply voltages. Generally, to achieve satisfactory useful battery life, the circuits must be designed to operate with little degradation of performance at least down to voltage levels having a magnitude equal to one-half that supplied by new batteries.

While most transistor circuits may be designed to efficiently and successfully meet the challenge of successful operation over a wide range of supply voltages, there are desirable transistor circuits which are not so accommodating. For example, transistorized class B push-pull amplifiers, which are required to efficiently meet the power output demands in some applications, are known to be particularly sensitive to the magnitude of bias voltage. More specifically, changes in the magnitude of bias voltage supplied to the transistors in such circuits are known to directly affect performance. If the magnitude of bias voltage is too high, the transistors conduct a relatively great amount of current even in the absence of an applied signal to be amplified, resulting in accelerated dissipation of energy from an associated power source and a strong likelihood that some of the circuit components may be overheated and thereby rendered defective. On the other hand, a low level of bias voltage is attended by a degradation of performance, known in the art as cross-over distortion. Such distortion is readily apparent to the user, in the case of a radio receiver, since the information originating at the broadcast station is no longer accurately reproduced by the loudspeaker of the radio. Therefore, it is highly desirable to provide some means whereby a stabilized voltage of low magnitude may be provided to bias class B push-pull amplifiers and other circuits sharing this infirmity of voltage sensitivity.

In most electronic circuits it is desirable generally to limit the power consumed to that necessary to perform a selected circuit function. In battery-powered equipment, the interest in low power consumption becomes acute, and may even be a primary design factor. In such equipment, the usable life span of the battery power supply varies inversely as the amount of power consumed from the battery. For this reason, the optimum voltage stabilizer will be one which consumes a minimum of power from the voltage supply. In the interest of reducing the amount of power consumed from a battery power supply, a voltage stabilizer should consume only the minimum amount of current from the battery required for adequate voltage stabilization.

In the prior art, mercury cells, breakdown diodes and forward-biased conventional diodes have been used as bias voltage stabilizers. Mercury cells give satisfactory performance and are frequently used in custom-made equipment; however, they are unduly expensive when considered for use in mass produced electronic equipments, such as radio receivers. In addition, mercury cells must be periodically replaced and require switching means to remove them from the circuit when the equipment is not in use. While the use of breakdown diodes and forward-biased conventional diodes provides a less expensive solution to the problem than the use of mercury cells, voltage regulators using such devices consume a large amount of current, as compared to the current consumption of the load to which they supply a stabilized voltage. Also, reasonably priced breakdown diodes and conventional diodes have characteristics which vary widely with temperature. In accordance with this invention the aforementioned limitations of prior art stabilizers are obviated and a voltage stabilizer is provided which is economical to manufacture, relatively temperature insensitive, and at the same time is conservative of power consumed from an associated power supply.

Accordingly, it is an object of this invention to provide an improved low voltage stabilizer for electronic equipment.

It is another object of this invention to provide, for semiconductor electronic equipment, a low voltage stabilizer which consumes a minimum of power.

It is yet another object of this invention to provide for a battery-powered semiconductor equipment, an improved low voltage stabilizer which consumes less power than prior art stabilizers of comparable cost.

It is still another object of this invention to provide, for a battery-powered semiconductor electronic equipment, an improved low voltage stabilizer for providing bias voltage to the output transistors of a class B push-pull amplifier.

Briefly summarized, the biasing circuit of this invention comprises, in the preferred embodiment thereof, a tunnel diode connected in series with a resistor across a battery. The resistor is selected to have a resistance magnitude such that the current flow through the tunnel diode is nearly equal to the diode valley current when the battery voltage is at the lowest magnitude for which normal circuit operation is desired. The tunnel diode then operates along the steeply rising positive resistance portion of its characteristic which is disposed toward the high current portion of its characteristic curve. In this region of operation, the voltage across the tunnel diode does not change appreciably for a wide range of current through the device. Therefore, an associated load disposed in parallel circuit relationship with the tunnel diode is provided with a stabilized low voltage over wide ranges of battery supply voltage. Most significantly, the tunnel diode provides good stabilization down to current values near its valley current, which is significantly less than the minimum current flow through conventional diodes for comparable stabilization.

Figure 1:
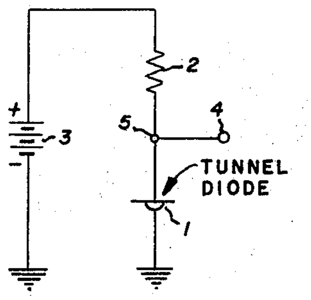
FIG. 1 shows a schematic diagram of the invention using a tunnel diode.
Figure 4:
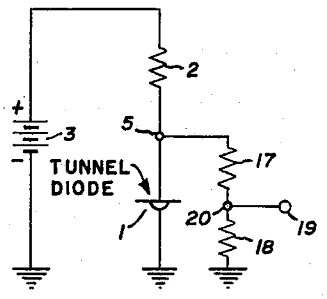
Figure 5:
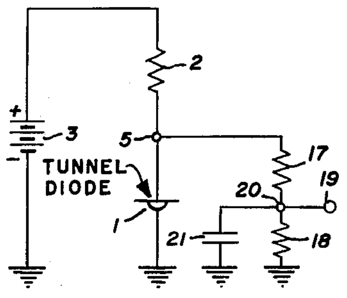
Figure 6:
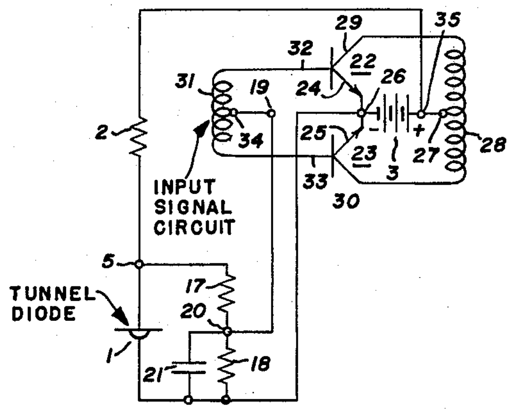
Figure 3:
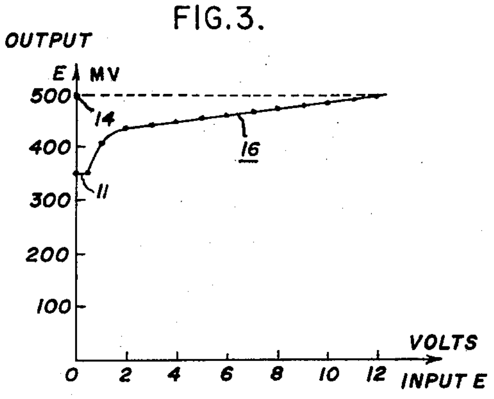
Figure 7:
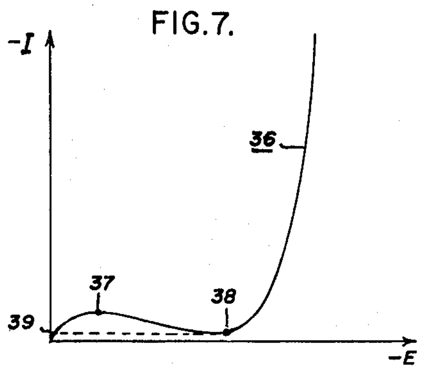
Figure 8:
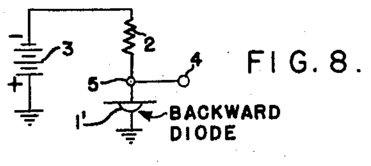

FIG. 3 is a graphical representation of the voltage regulation obtained when using the circuit of FIG. 1, FIG. 4 shows a schematic diagram of an alternative embodiment of the invention, FIG. 5 shows still another alternative embodiment of the invention, FIG. 6 schematically represents the embodiment of FIG. 5 in combination with a transistorized push-pull amplifier, FIG. 7 shows the current-voltage characteristic of a back diode, and FIG. 8 is a schematic diagram of an alternative embodiment of the invention using a backward diode.

While this invention pertains generally to low voltage stabilizers which use semiconductor junctions that exhibit the quantum mechanical tunneling phenomenon known as the tunnel effect, the invention will be described with reference to a particular one of such devices, namely the tunnel diode. FIG. 1 illustrates, schematically, a tunnel diode 1 having its anode connected to resistor 2, which is adapted to be connected to a source 3 of unidirectional voltage. The unidirectional output voltage from the circuit is supplied from terminal 4 which is connected to the junction 5 of tunnel diode 1 and resistor 2. The cathode of tunnel diode 1 and the return terminal of source 3 are grounded.

Figure 2:
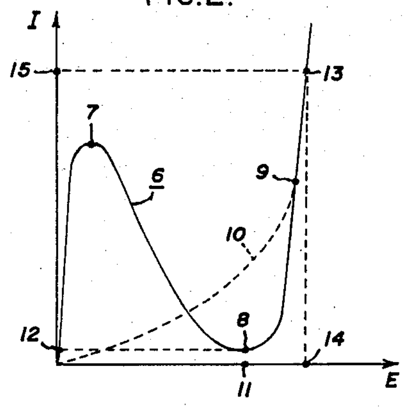
FIG. 2 illustrates the current-voltage characteristic of a tunnel diode.

FIG. 2 presents, graphically, the current-voltage characteristic of a tunnel diode with current plotted along the ordinate and voltage plotted along the abscissa. The characteristic curve, generally shown at 6, exhibits a peak point 7 and valley point 8, commonly associated with tunnel diodes. After valley point 8, characteristic curve 6 rises sharply to point 9 through a positive resistance region, and thereafter the curve displays a conventional diode characteristic. By way of comparison, dashed line 10 is shown extending from the origin to point 9 and indicates the conventional diode characteristic in the low voltage region.

In order to provide the desired range of stabilizer performance, the resistance value of resistor 2 is selected to provide operation of the tunnel diode near valley point 8 when the voltage magnitude of source 3 is equal to a predetermined lower useful voltage limit. When the battery voltage is at the lower limit, the voltage developed across the tunnel diode will be of value shown at 11, on the abscissa. The corresponding current flow through the tunnel diode, and the serially-disposed resistor, will be of the value shown at 12, on the ordinate. When the battery voltage is at its upper limit, operation of the tunnel diode will be at some point such as shown at 13 on curve 6 and the corresponding tunnel diode voltage and current will be as shown at points 14 and 15, respectively. For intermediate values of battery voltage, the tunnel diode will operate at some point on curve 6 between valley point 8 and point 13.

The value of current at point 15 is the maximum current consumed by the stabilizer from power source 3, and occurs when the voltage of the source is at its predetermined upper voltage limit. The value of current at point 15 is dependent upon the value of current at point 12, which is the valley point current of the tunnel diode, and the ratio of the predetermined upper voltage limit to the predetermined lower useful voltage limit of power source 3. In fact, the magnitude of current at point 15 is substantially equal to the product of the current value at point 12 and the power supply voltage limit ratio, when the lower useful voltage limit of source 3 is much greater than the voltage drop across tunnel diode 1. Since the current consumed by the regulator is directly related to power drained from source 3, it is desirable to have the various current values maintained at a minimum. Therefore, it is necessary to provide a low value of current 12 in order to minimize power consumption from source 3 for a given range of source voltage to be regulated.

FIG. 3 shows graphically the stabilization achieved by using the circuit of FIG. 1. The ordinate represents output voltage in millivolts derived from terminal 4, and the abscissa designates various values of input voltage supplied from source 3. The plotted curve, generally shown at 16 is constructed from measurements taken for a circuit such as shown schematically in FIG. 1 wherein the resistance value of resistor 2 is 10,000 ohms. Voltage points 11 and 14 correspond to the same numbered points in FIG. 2. The maximum current consumed by the voltage stabilizer circuit was found to be slightly less than 1.2 milliamps. Voltage stabilizing performance of the circuit is seen to be particularly satisfactory over a range of source voltages from 2 to 12 volts. Comparable stabilization from a conventional germanium diode, which has a characteristic curve in the low voltage region such as shown at 10, results in a current drain from power source 3 which is many times greater than that required when using the circuit of this invention.

FIG. 4 shows an alternative embodiment of the invention which may be used when it is desired to obtain a stabilized votlage of lesser magnitude than that obtained from the circuit of FIG. 1. In such event a resistance voltage divider is used comprising serially-disposed resistors 17 and 18 connected in parallel across tunnel diode 1. The voltage is then obtained from output terminal 19 which is connected to the junction 20 of resistor 17 and resistor 18.

When it is necessary that the volage stabilizer provide an output votlage having a low impedance to alternating currents, the alternative embodiment of this invention schematically shown in FIG. 5 is used. A capacitor 21 is shown disposed in parallel with resistor 18 to provide at terminal 19 a low value of impedance to alternating currents. The addition of capacitor 21 does not appreciably alter the circuit performance in normal uses, wherein the voltage of sources 3 does not vary rapidly but rather decays slowly over a long period of time.

FIG. 6 is a schematic diagram of the invention, as shown in FIG. 5, in combination with a transistorized class B push-pull amplifier of the common emitter configuration. The low voltage stabilizer of FIG. 5 provides the transistor bias voltage.

The amplifier of FIG. 6 comprises a pair of transistors 22 and 23 having their respective emitter electrodes 24 and 25, connected together at junction 26. Junction 26 is also the negative terminal of voltage source 3 which supplies both the amplifier and stabilizer circuit. The positive terminal of voltage source 3 is connected to center tap 27 of output winding 28. Opposite extremities of output winding 28 are connected to collector electrodes 29 and 30 of transistors 22 and 23, respectively. A signal to be amplified is supplied to the amplifier circuit through winding 31 which is connected at opposite extremities thereof to base electrodes 32 and 33 of transistors 22 and 23, respectively, for supplying phase-reversed signals thereto, all as is well known in the art.

In accordance with this invention, voltage stabilizer output terminal 19 is connected to center tap 34 on winding 31. The common junction of the cathode of tunnel diode 1, capacitor 21 and resistor 18 is connected to the negative terminal 26 of voltage source 3. Thereafter, when resistor 2 is connected to the positive terminal 35 of voltage source 3, transistors 22 and 23 are each forward biased by a predetermined amount dependent upon the characteristic of tunnel diode 1 and the relative resistance values of resistors 17 and 18.

In operation, tunnel diode 1 starts conduction at a point, such as 13 of FIG. 2, on its characteristic curve when the voltage of source 3 is at its predetermined upper limit. Thereafter, as the voltage of source 3 decays, tunnel diode 1 conducts along its characteristic between point 13 and point 8, reaching the latter point when the voltage of source 3 has decayed to its predetermined lower useful voltage limit. The voltage across tunnel diode 1 is stabilized, as shown in FIG. 3, providing a relatively constant bias voltage to transistors 22 and 23 so that the desired forward bias level is maintained. The wide range of effective impedance of tunnel diode 1, as it conducts at various points between point 13 and point 8 of its characteristic curve, allows the stabilizer to perform its required voltage-regulating function without drawing excessive current from voltage source 3.

FIG. 7 shows the characteristic curve of another tunnel effective device which makes use of the quantum mechanical tunneling phenomenon, namely the backward diode. It will be noted that both the ordinate and abscissa of the graph shown are indicated to be of negative polarity and, in fact, the graph shown normally occupies the third quadrant of the current-voltage characteristic of such devices. The characteristic curve, generally shown at 36 exhibits a peak point 37 and a valley point 38 not unlike the tunnel diode characteristic of FIG. 2. Generally the peak point 37 of a backward diode occurs at a magnitude of current which is less than the magnitude of current at peak point 7, of a tunnel diode. A wide range of current values are available in production backward diodes. For example, backward diodes manufactured by the assignee of the present invention, series 4JF2A, have a range of peak point currents from 1 to 0.01 milliamp. More significant, however, is the fact that backward diodes are available with valley point currents 39 which are even less than the valley point current 12 of the tunnel diode. Therefore, stabilizer circuits using backward diodes may be provided having a wide range of voltage regulation while at the same time consuming very little current. In the event that a relatively high direct current impedance may be tolerated, as viewed from the stabilizer output terminal, then the optimum choice is a backward diode biased to its valley point.

In order to substitute backward diodes for the tunnel diodes in the circuits of FIGS. 1, 4 or 5, the polarity of voltage source 3 is reversed. The anode of the backward diode is then connected to resistor 2 and the cathode is grounded, as with the tunnel diode, as illustrated in FIG. 8 wherein the backwarmd diode is designated by numeral 1'. The polarity of stabilized voltage obtained from terminal 4 or 19 is reversed. As another example, if transistors 22 and 23 of FIG. 6 are of the PNP type, rather than the NPN type shown, and the polarity of voltage source 3 is reversed, a backward diode may be substituted for tunnel diode 1 with the same anode and cathode connections shown. When substituting backward diodes for the tunnel diodes shown in the various figures, the stabilized output voltage obtained will be substantially unchanged if the devices are of the same general type, that is to say both germanium or both silicon, for example. Normally, a different resistance value will be required for resistor 2 in order to bias the backward diode near its valley point 38 when the voltage of source 3 is near its predetermined lower useful voltage limit.

It may be desirable to provide a direct current impedance, as viewed from the stabilizer output, which is less than that obtained by biasing the tunnel effect diode at valley point 8 or 38. In such event, the direct current impedance may be decreased by biasing the diode closer to point 9. It will be apparent to those skilled in the art that the advantages of this invention will still be realized, though somewhat diminished, by biasing the diode in the vicinity of its valley point on the positive resistance portion of the current-voltage characteristic. More specifically, the minimum operating point for the diode may be selected anywhere on the characteristic between valley point 8 and point 9, as seen in FIG. 2, and yet achieve better stabilizer performance than when using a conventional diode having characteristics generally represented by dashed line 10. The term, "near the valley point," as used herein is intended to include the range from valley point 8 to point 9 in FIG. 2, and a similar range in FIG. 7, these ranges being adjacent to the valley points 8 and 38 of the characteristic curves 6 and 36 and at the sides thereof away from the peak points 7 and 37.

There has been shown and described herein a low voltage stabilizer which consumes less power than prior art stabilizers of comparable cost. This is accomplished, in accordance with the present invention, by utilizing in the stabilizer circuit a tunnel effect diode which makes use of the quantum mechanical tunneling phenomenon. The power saving capabilities of the stabilizer circuit of this invention are fully exploited by biasing the diode substantially at its valley point, when the voltage of the source to be regulated is at a minimum.

While it has been shown that the voltage stabilizer of this invention is particularly well suited for use in transistorized class B push-pull circuits, it will be understood that the invention may be used with equal facility to provide a stabilized low voltage to any load from a widely varying source of higher voltage. Various other modifications and variations of this invention will suggest themselves to those skilled in the art, without departing from the scope of this invention as defined by the following claims.

What is claimed as new and desired to be secured by Letters Patent of the United States is:

1. A voltage stabilizer arranged to provide a substantially constant unidirectional output voltage from a source of unregulated unidirectional voltage having a predetermined lower useful voltage limit, comprising: a tunnel effect diode having a valley point on its current-voltage characteristic curve; conductive means connecting one electrode of said diode to an output terminal of said source; current-limiting means connecting the other electrode of said diode to another output terminal of said source; said current-limiting means restricting operation of said diode to a point on said current-voltage characteristic near the valley point when the voltage of said source is equal to the magnitude of said predetermined lower useful voltage limit; whereby a substantially constant unidirectional voltage is provided between the electrodes of said diode; and output terminal means respectively connected to said electrodes of the diode for deriving said constant voltage therefrom.

2. The voltage stabilizer of claim 1 wherein said tunnel effect diode is a backward diode.

3. The voltage stabilizer of claim 1 wherein said tunnel effect diode is a tunnel diode.

4. A voltage stabilizer arranged to provide a substantially constant unidirectional output voltage from a source of unregulated unidirectional voltage having a predetermined lower useful voltage limit, comprising: a tunnel diode having an anode and a cathode; conductive means connecting said cathode to a negative terminal of said source, a resistor connected from said anode to a positive terminal of said source, said resistor having a resistance value to provide conduction of said tunnel diode in the positive resistance region near the valley point when the voltage of said source is equal to said predetermined lower useful voltage limit, whereby a substantially constant voltage is provided between the anode and cathode of said tunnel diode; and output terminal means respectively connected to said anode and cathode of the tunnel diode for deriving said constant voltage therefrom.

5. A voltage stabilizer arranged to provide a substantially constant unidirectional output voltage from a source of unregulated unidirectional voltage having a predetermined lower useful voltage limit, comprising: a backward diode having an anode and a cathode, conductive means connecting said cathode to a positive terminal of said source, a resistor connected from said anode to a negative terminal of said source, said resistor having a resistance value to provide conduction of said backward diode in the positive resistance region near the valley point when the voltage of said source is equal to the magnitude of said predetermined lower useful voltage limit, whereby a substantially constant voltage is provided between the cathode and anode of said backward diode, and output terminal means respectively connected to said anode and cathode of the backward diode for deriving said constant voltage therefrom.

6. In a transistorized class B push-pull amplifier of the common emitter configuration having an input transformer with a center-tapped winding supplying phase-reversed signals to the respective base electrodes of two transistors, the improvement comprising transistor-biasing means including:

(a) a power source having output terminals supplying an unregulated unidirectional output voltage having a predetermined lower useful voltage limit;

(b) a tunnel effect diode and current-limiting means disposed in series circuit relationship between the output terminals of said source, said current-limiting means having a resistance value to provide conduction of said diode in the positive resistance region near the valley point of its current-voltage characteristic when said output voltage is equal to said predetermined lower useful voltage limit; and, (c) conductive means connecting said diode from the tap of said center-tapped winding to the emitter electrodes of said transistors, said diode being poled to forward bias said transistors, whereby said diode provides a substantially constant bias voltage for said transistors.

References Cited by the Examiner

FOREIGN PATENTS

| | | |
|---|---|---|
| 1,127,863 | 8/1956 | France. |
| 897,688 | 5/1962 | Great Britain. |

OTHER REFERENCES

Army Technical Manual, TM 11–690, Basic Theory and Application of Transistors, March 1959, pages 98–99.

G. E. Tunnel Diode Manual, March 3, 1961, pages 7–13, 55.

Gentile: Basic Theory and Applications of Tunnel Diodes, D. Van Nostrand Co., Inc., Princeton, N.J., publication date Oct. 23, 1962, pages 112–114, 159–161 relied on.

McDaniel: Use of Uni-Tunnel Diodes for Tunnel Diode Biasing, Span, May–June 1961, Hoffman Electronics Corp., Semiconductor Div., 3 page article.

ROY LAKE, *Primary Examiner.*

NATHAN KAUFMAN, *Examiner.*